(12) United States Patent
Goruganthu et al.

(10) Patent No.: US 10,132,861 B2
(45) Date of Patent: Nov. 20, 2018

(54) VISIBLE LASER CIRCUIT FAULT ISOLATION

(71) Applicant: QUALCOMM Incorporated, San Diego, CA (US)

(72) Inventors: Rama Rao Goruganthu, Austin, TX (US); Gaurav Sunil Mattey, San Diego, CA (US); Martin Villafana, Bonita, CA (US)

(73) Assignee: QUALCOMM Incorporated, San Diego, CA (US)

( * ) Notice: Subject to any disclaimer, the term of this patent is extended or adjusted under 35 U.S.C. 154(b) by 106 days.

(21) Appl. No.: 15/268,463

(22) Filed: Sep. 16, 2016

(65) Prior Publication Data
US 2018/0080983 A1 Mar. 22, 2018

(51) Int. Cl.
*G01R 31/308* (2006.01)
*G01R 31/311* (2006.01)
*G01R 1/07* (2006.01)
*G01R 31/28* (2006.01)

(52) U.S. Cl.
CPC ............ *G01R 31/311* (2013.01); *G01R 1/071* (2013.01); *G01R 31/2834* (2013.01)

(58) Field of Classification Search
CPC ......... H01L 23/3738; H01L 2924/1532; H01L 22/12; H01L 2924/181; G01R 31/311; G01R 31/2891; G01R 31/308; G01R 1/07; G01R 31/26; G01R 31/30; G01R 31/31917; G01R 31/2656; G01R 31/307; G01R 31/2874; G01N 2021/4709; G01N 2021/4733; G01N 21/47; G01N 21/21; G01N 21/31; G01N 21/553; G01N 21/8806; G02F 1/093; G02F 2201/58
See application file for complete search history.

(56) References Cited

U.S. PATENT DOCUMENTS

| 6,243,350 | B1 * | 6/2001 | Knight .................. B82Y 10/00 369/112.24 |
| 7,224,828 | B2 | 5/2007 | Cotton et al. |
| 7,826,045 | B2 | 11/2010 | Ippolito et al. |
| 8,248,097 | B2 | 8/2012 | Ippolito et al. |

(Continued)

FOREIGN PATENT DOCUMENTS

WO WO-2008062341 A1 5/2008

OTHER PUBLICATIONS

Boit C., et al., "Contactless Visible Light Probing for Nanoscale ICs through 10 [mu]m Bulk Silicon," Proceedings of the 35th Annual NANO Testing Symposium (NANOTS2015), Osaka: Institute of NANO Testing, Jan. 1, 2015, pp. 215-221, XP055415834, Retrieved from the Internet: URL:https://depositonce.tu-berlin.de/bitstream/11303/6402/3/Boit_etal_NANOTS2015.pdf.

(Continued)

*Primary Examiner* — Vinh Nguyen
(74) *Attorney, Agent, or Firm* — Haynes and Boone, LLP (57) ABSTRACT

A transparent coversheet intervenes between a lens and a thinned die in a visible light fault analysis tool so that the thinned die is robust to fractures. In addition, the transparent coversheet has a greater thermal mass than the thinned die and thus acts as a heat sink to prevent active circuitry in the thinned die from overheating during the visible light fault analysis.

17 Claims, 5 Drawing Sheets

(56) References Cited

U.S. PATENT DOCUMENTS

| | | | |
|---|---|---|---|
| 2003/0218851 A1* | 11/2003 | Harris | H01L 23/62 |
| | | | 361/118 |
| 2009/0284736 A1 | 11/2009 | Tosi et al. | |
| 2010/0253379 A1* | 10/2010 | Ippolito | G01R 31/311 |
| | | | 324/762.05 |
| 2015/0002182 A1 | 1/2015 | Eiles et al. | |
| 2015/0293036 A1 | 10/2015 | Nakamura | |
| 2016/0116531 A1 | 4/2016 | Ranganathan et al. | |

OTHER PUBLICATIONS

International Search Report and Written Opinion—PCT/US2017/047013—ISA/EPO—dated Oct. 23, 2017.
Yoshida T., et al., "Proposal of Backside Die-level Analysis," International Symposium on Semiconductor Manufacturing (ISSM), Jan. 1, 2008, pp. 386-389, XP055415832.

* cited by examiner

VISIBLE LASER CIRCUIT FAULT ISOLATION

TECHNICAL FIELD

This application relates generally to circuit fault analysis, and more particularly to a circuit fault analysis using a visible laser.

BACKGROUND

Conventional laser fault isolation techniques for circuit analysis such as laser voltage probing (LVP) and dynamic laser stimulation (DLS) use an infrared laser as silicon is relatively transparent to infrared wavelengths. Although infrared laser light may thus penetrate through the substrate to illuminate the active circuits, the spatial resolution for conventional laser fault techniques is limited by the relatively long wavelengths of infrared light. The spatial resolution for conventional techniques has thus become too coarse for advanced process nodes such as 14 nm or smaller.

Figure 1:
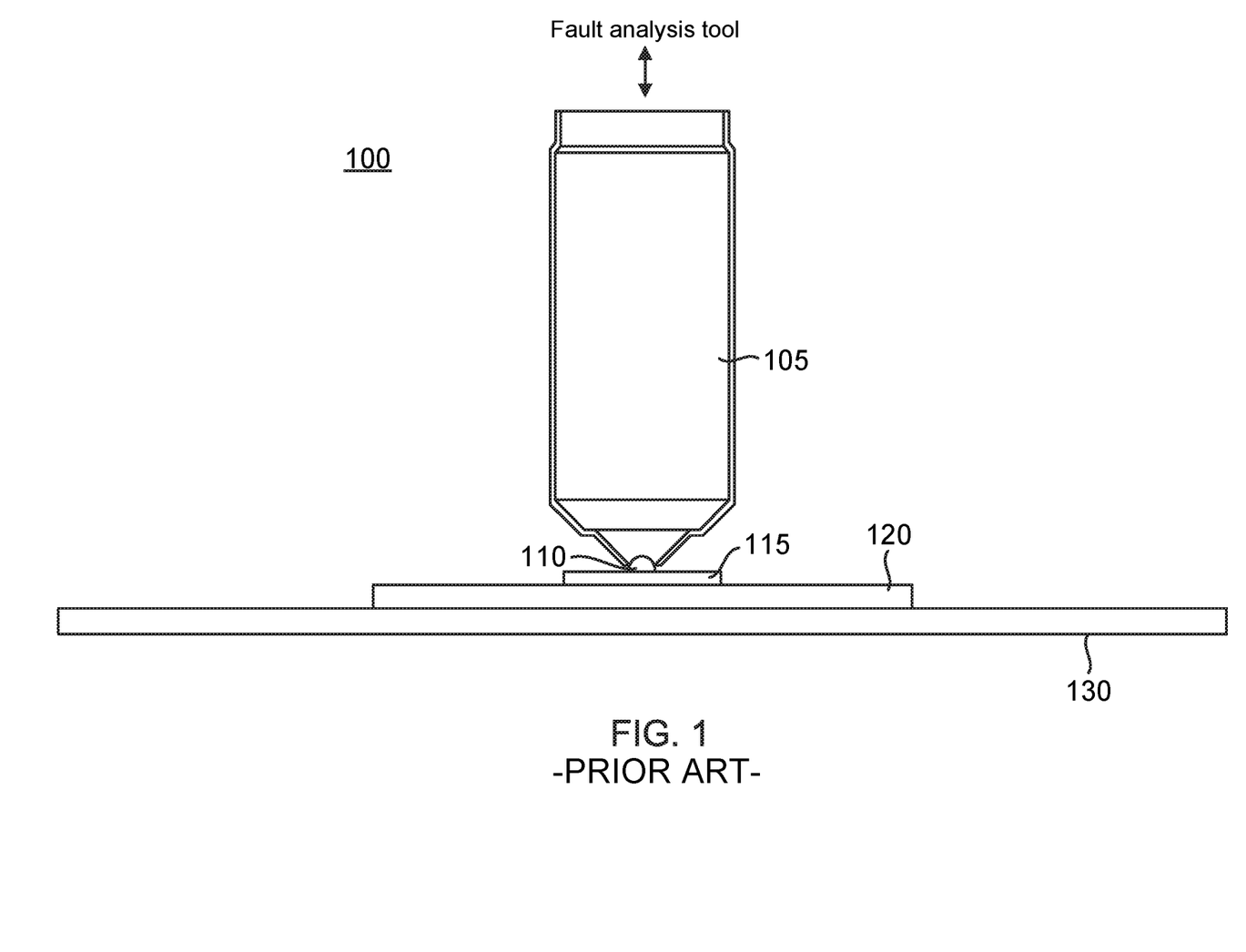
FIG. 1 illustrates a conventional visible light fault analysis system.

To provide sufficient resolution for advanced process nodes, various laser fault isolation techniques have been proposed that utilize visible lasers due to the relatively short wavelengths for visible light as compared to infrared illumination. An example visible laser fault analysis system 100 is shown in FIG. 1. A thinned die 115 is mounted in a carrier 120 that is in turn held by a socket 130. The active surface of thinned die 115 faces carrier 120 so that electrical connections may be made to drive the circuitry within the active surface. The backside of thinned die 115 contacts a solid immersion lens (SIL) 110 held by a backing objective 105. Silicon is very absorptive to visible light such that the backside of thinned die 115 must be ground down until thinned die 115 is approximately 2 microns in thickness. The resulting silicon substrate for thinned die 115 is very fragile and readily cracked as SIL 110 must be in contact with thinned die 115 for proper imaging. In addition, the thinned silicon substrate has low thermal mass such that it is prone to overheating during the fault analysis. Conventional fault analysis with visible light is thus hampered by die fragility and overheating issues.

Accordingly, there is a need in the art for improved fault analysis tools and techniques using a visible laser light source.

SUMMARY

To provide the increased resolution of a visible light fault analysis while addressing the die fragility and overheating issues of conventional fault analyses, the backside of a thinned die is covered with a transparent cover sheet. The transparent cover sheet may be relatively thick so as to be robust to the pressure from a solid immersion lens. For example, the transparent cover sheet may be approximately 100 microns in thickness. In contrast, the backside of the die is thinned such that the thinned die may be approximately 1 to 3 microns in thickness. Such a relatively thin die reduces the light absorption from the silicon substrate in the thinned die. But the resulting fragility for the thinned die does not result in breakage due to the distribution of the contact force from the solid immersion lens on the transparent cover sheet across the entire backside of the thinned die.

The transparent cover sheet and the solid immersion lens may be constructed from the same material to prevent losses from any differences in the index of refraction between the solid immersion lens and the transparent cover sheet. In addition, the transparent coversheet material may have a high refractive index to aid in the imaging and also have good thermal conductivity to conduct heat from the thinned die. For example, the solid immersion lens and the transparent coversheet may both be constructed from gallium phosphide (GaP), aluminum phosphide (AlP), indium phosphide (InP), diamond, or other suitable material having an index of refraction greater than 2.4 in the visible wavelengths and having a thermal conductivity greater than 5 watts/meter-Kelvin (W/m-k).

These and additional advantages may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figure.

DETAILED DESCRIPTION

The resolution of laser-assisted fault analysis of integrated circuits is proportional to a ratio of the laser light wavelength and the numerical aperture of the objective. To increase resolution, one can thus either decrease the light wavelength (increase the frequency of the laser light) and/or increase the numerical aperture of the objective. Solid immersion lenses have advantageously high numerical apertures and are thus commonly used in laser-assisted fault analyses. But increasing the light wavelength from the infrared regime into the visible light band has been hampered by the opacity of silicon to visible light. To limit this opacity, it is conventional to reduce the thickness of the silicon substrate of the die by grinding down the backside of the die. But the resulting thinned die is then subject to fracture and overheating. These issues are solved herein through the advantageous use of a transparent coversheet that intervenes between the solid immersion lens and the backside of the thinned die. Unlike the thinned die, the transparent coversheet may be relatively robust since it does not significantly absorb visible light.

For example, the transparent coversheet may be tens of microns to 100 microns or more in thickness. The solid immersion lens may then contact the transparent coversheet without the danger of fracture to the transparent coversheet. Since this contact force on the transparent coversheet is distributed across the entire backside of the thinned die, the resulting contact force on the thinned die is merely compressive. In contrast, if the solid immersion lens instead contacts the backside of the thinned die as in a conventional fault analysis using visible light, the thinned die is subjected to tensile stress in addition to the compressive force. Since the thinned die is quite fragile, this tensile force leads to cracking and die failure. In contrast, the transparent coversheet disclosed herein prevents the application of tensile force. Even though the thinned die is quite fragile to tensile force, it is relatively robust to the compressive force from the solid immersion lens contacting the transparent coversheet.

Figure 2:
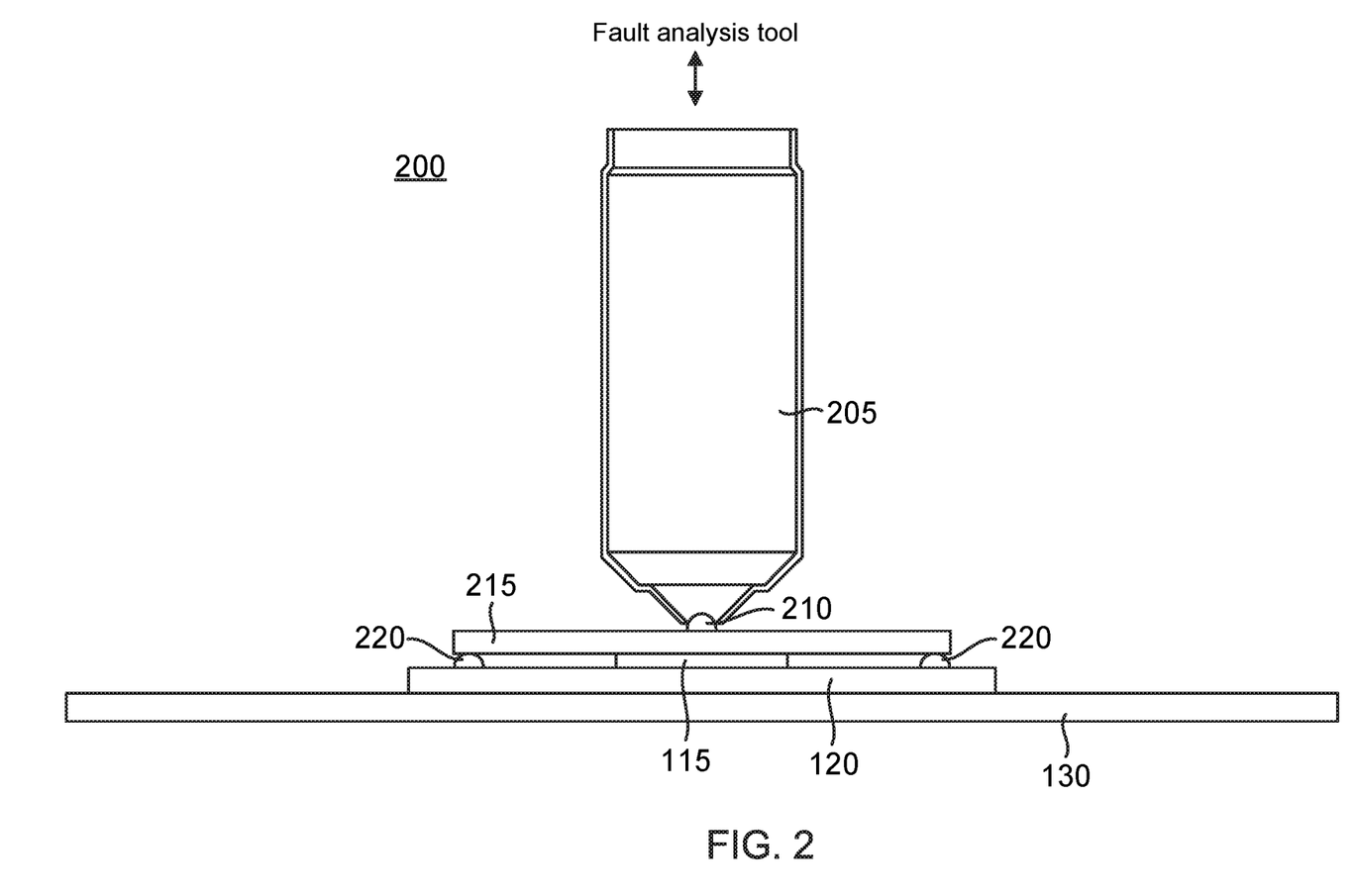
FIG. 2 illustrates a visible light fault analysis system including a transparent coversheet in accordance with an aspect of the disclosure.

The use of the transparent coversheet not only solves the fragility issues of the thinned die but also acts as a heat sink to the thinned die. The thinned silicon die has a relatively low thermal mass and is thus prone to overheating while its active circuits are driven with electrical signals during the fault analysis. The coversheet has a significantly greater thermal mass and thus conducts heat away from the thinned die, eliminating the overheating issues as well. Furthermore, a cold plate (not illustrated) may be disposed in contact with the top surface of transparent coversheet 215 to remove large quantities of heat.

The front side (active surface) of the thinned die is carried in a socket for fault analysis. The thinned die is thus sandwiched by the socket and the transparent coversheet. During a visible laser fault analysis, visible laser light projects from the lens and through the coversheet to interact with the active circuitry on the front side of the thinned die. The reflected laser light and/or resulting electrical signal from the thinned die is then analyzed by the remainder of a laser-assisted fault analysis tool. For example, the fault analysis tool may be a laser voltage probe fault analysis tool or a dynamic laser stimulation fault analysis tool. Advantageously, these analyses get the benefit of visible light resolution yet the thinned die remains robust to fracture and overheating. Some example embodiments will now be discussed in more detail.

A laser-assisted fault analysis tool 200 shown in FIG. 2 includes a transparent coversheet 215 having a planar first surface contacting a planar backside of a thinned die 115. The silicon substrate in thinned die 115 is reduced to a thickness of approximately 2 microns to facilitate an analysis using visible laser light such as in the blue frequency band. Such a relatively high frequency band offers advantageous resolution but is subject to considerable absorption by the silicon substrate in thinned die 115. Should the laser light travel more than approximately 5 microns through the silicon substrate, it will be absorbed to such an extent that the reflected laser light in a visible laser light fault analysis would be difficult to detect. By grinding the backside of the silicon substrate in thinned die 115 down to approximately 2 microns, the total optical path (incident and reflected) through the silicon substrate in thinned die 115 is below this approximately 5 micron conduction path limit. For example, a chemical-mechanical polishing tool may be used on the backside of the silicon substrate to produce thinned die 115.

The active circuitry in thinned die 115 is on its front side, which couples to a carrier 120. Carrier 120 has terminals (not illustrated) that are connected through soldering or copper bumps to corresponding terminals (not illustrated) such as front side pads on thinned die 115 so that an appropriate electrical stimulus may be applied to the active circuitry in thinned die 115. For example, in a laser voltage probe analysis, the electrical stimulus causes transistors in the thinned die to switch on and off according to a switching frequency. During the laser voltage probing, visible laser light transmits through an objective backing 205 and a lens such as a solid immersion lens (SIL) 210 and through transparent coversheet 215 to propagate into the backside of thinned die 115. The changing electrical field in the switched transistors in thinned die 115 responsive to the electrical stimulus modulates the reflected laser light that exits the backside of thinned die 115, transmits through transparent coversheet 215 and is focused by SIL 210. As will be explained further herein, an RF detector is used in a laser voltage probe analysis to detect the modulation of the reflected laser light. If this modulation is not present, it may be assumed that the illuminated transistor is faulty such that it does not switch responsive to the electrical stimulus as would be expected from the design of the integrated circuit.

Carrier 120 includes a plurality of female adapters that receive test pins (not illustrated) from a socket 130. Carrier 120 includes a plurality of through vias (not illustrated) that couple the desired electrical stimulus from the test pins in socket 130 to the appropriate terminals in thinned die 115. In addition, socket 130 includes a plurality of alignment pins that are received by carrier 120 to assist in the accurate illumination of the desired active circuitry in thinned die 115.

Solid immersion lens 210 contacts a backside (second surface) of transparent coversheet 215, which may be constructed from a suitable material such as GaP, AlP, InP, or diamond. Solid immersion lens 210 may be constructed from the same suitable material used to form transparent coversheet 215 so that both elements share the same refractive index. The following discussion will be directed to embodiments in which both solid immersion lens 210 and transparent coversheet 215 are constructed from GaP without loss of generality. Transparent coversheet 215 is relatively thick so as to be robust to the tensile stress from the contact with solid immersion lens 210. For example, transparent coversheet 215 may be tens of microns to 100 microns or greater in thickness. This relative thickness of transparent coversheet 215 has the additional advantage or reducing construction costs for solid immersion lens 210 as it may now focus the visible laser light at a relatively greater distance as compared to solid immersion lens 110 in conventional fault analysis tool 100.

Transparent coversheet 215 is not just thicker than thinned die 115 but may also be wider such that it contacts the entire backside of thinned die 115. In this fashion, transparent coversheet 215 only subjects thinned die 115 to a compressive force that is spread across its entire backside surface of thinned die 115 while subjecting thinned die 115 to virtually no tensile stress. Thinned die 115 is thus robust to the compressive force and does not suffer cracking in the absence of tensile stress. To assist the conduction of heat away from thinned die 115 through transparent coversheet 215, the outer edges of transparent coversheet 215 may be bonded to carrier 120 through thermally-conductive bonds 220.

In one embodiment, transparent coversheet 215 may be deemed to comprise a means intervening between the solid immersion lens 210 and the backside of the thinned die 115 for conducting heat away from the active circuitry. Similarly, transparent coversheet 215 may also be deemed to comprise a means intervening between solid immersion lens 210 and the backside of thinned die 115 for preventing a tensile stress on thinned die 115 during a fault analysis using solid immersion lens 210.

Figure 3A:
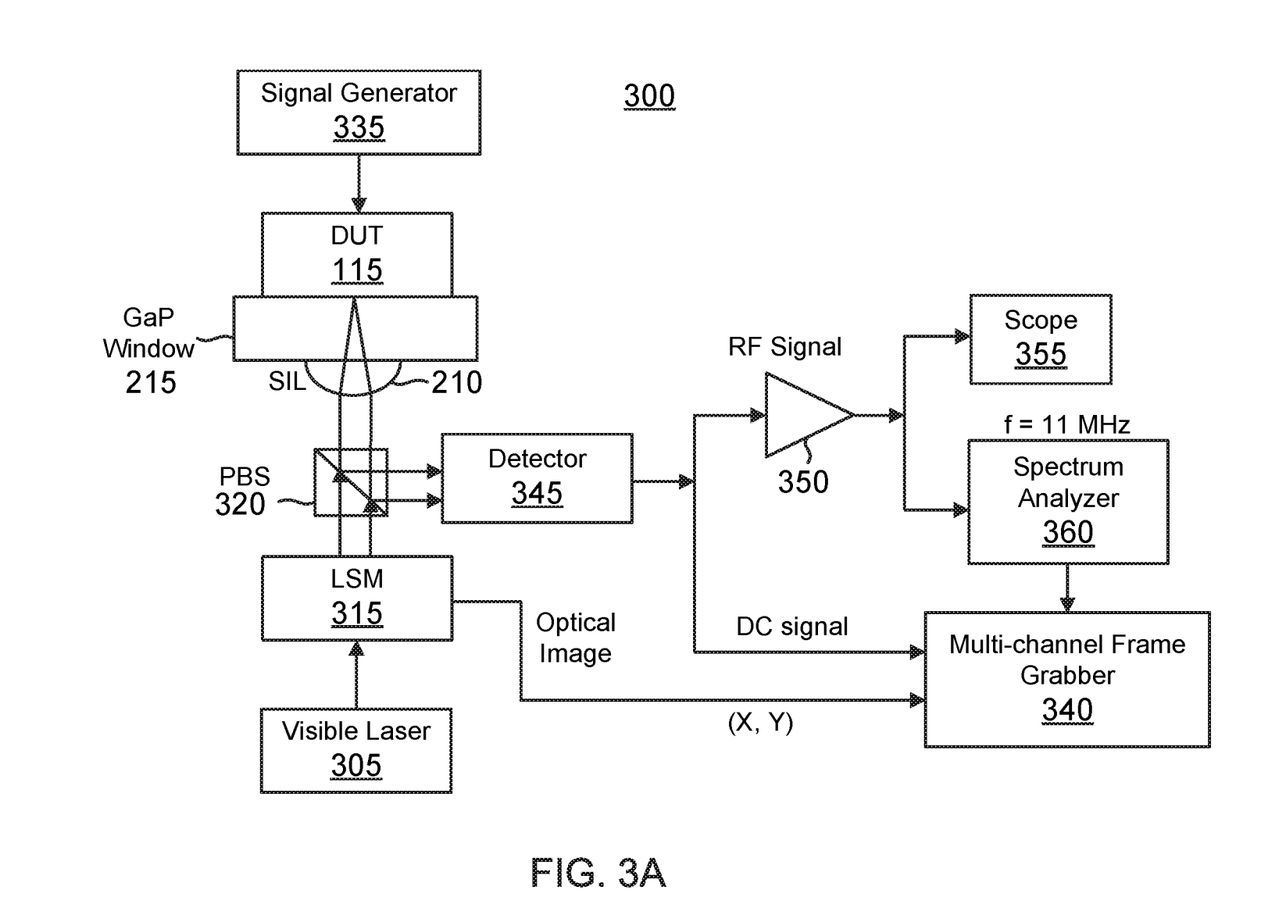
FIG. 3A illustrates a laser voltage probing system including a visible light laser and a transparent coversheet in accordance with an aspect of the disclosure.

The remainder of fault analysis tool 200 depends upon the particular application. For example, transparent coversheet 215 may be advantageously employed in either a laser voltage probe analysis or a dynamic laser stimulation analysis. An example laser voltage probe (LVP) fault analysis tool 300 is shown in FIG. 3A. The visible laser light from a visible laser 305 passes through a laser scanning module (LSM) 315 and a polarizing beam splitter (PBS) 320 before being focused in SIL 210 through the GaP transparent coversheet (which may also be denoted as a GaP window) 215 onto the backside surface of thinned die 115. Thinned die 115 may also be denoted as the device-under-test (DUT) 115 as is conventional in a fault analysis. During an analysis by LVP system 300, DUT 115 receives a signal test vector from a signal generator 335 such as a pulse generator. This signal test vector is driven through the test pins in carrier 130 as discussed with regard to FIG. 2 to stimulate DUT 115. It will be appreciated that visible laser 305 may be replaced by a light emitting diode (LED) such as a superluminescent light emitting diode (SLED) in alternative embodiments.

Based upon the reflected laser light from DUT 115, laser scanning module 315 produces an optical image (X,Y) that is sampled in a multi-channel frame grabber 340. However, it will be appreciated that other signal detection schemes in lieu of frame grabbing may be implemented. By identifying circuit landmarks in the resulting optical image, a technician using system LVP 300 can be assured that the desired target circuitry, e.g., a depletion region in a transistor, within DUT 115 is being illuminated by visible laser 305.

The illuminated transistor will have varying optical parameters in response to the excitation from signal generator 335. These varying optical parameters modulate the reflected laser light from DUT 115 that is received by polarizing beam splitter 320 and directed to an RF detector 345. For example, if signal generator 335 produces an 11 MHz excitation of DUT 115 and DUT 115 is operating normally in response to this excitation, a detected signal from RF detector 345 will have an 11 MHz RF component. An RF amplifier 350 amplifies the RF signal from RF detector 345 to drive an oscilloscope 355 and/or a spectrum analyzer 360. The DC component of the detected signal is used to generate the optical image of DUT 115. It will be appreciated that spectrum analyzer 360 may be replaced by alternative analyzers such as an off-board data analyzer in alternative embodiments.

Figure 3B:
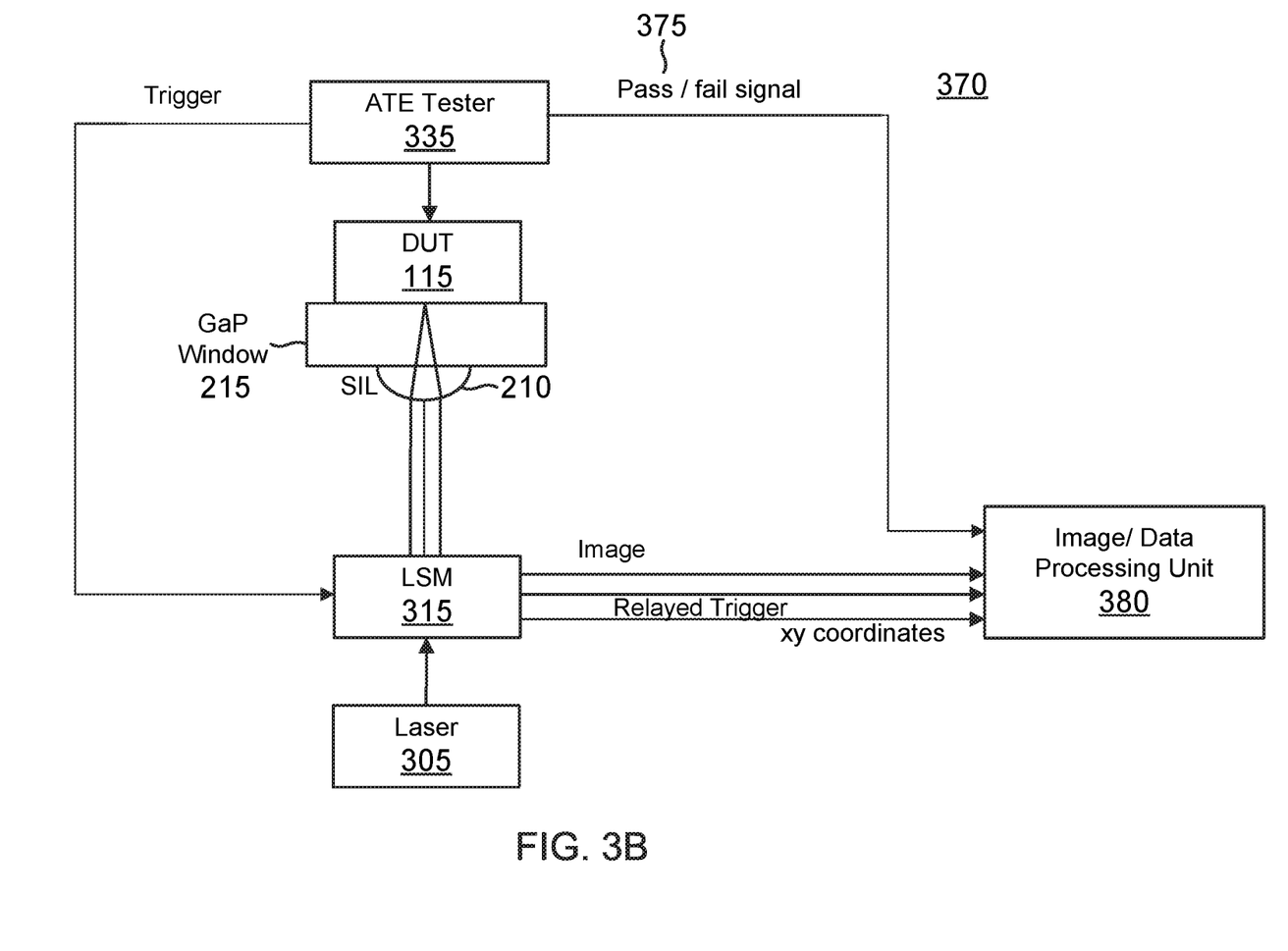
FIG. 3B illustrates a dynamic laser stimulation system including a visible light laser and a transparent coversheet in accordance with an aspect of the disclosure.

The benefits of GaP coversheet 215 may also be enjoyed by a dynamic laser stimulation (DLS) system 370 as shown in FIG. 3B. DLS system 370 includes a laser scanning module (LSM) 315, a PBS 320, a detector 345, SIL 210, and a DUT 115 as discussed with regard to LVP system 300. However, in DLS system 370, signal generator 335 comprises an automated test equipment (ATE) tester. ATE tester 335 drives DUT 115 with an input signal vector and monitors a corresponding output signal vector from DUT 115 to produce a pass/fail signal 375. If the state of the output vector is appropriate given the corresponding input vector, ATE tester 335 asserts pass/fail signal 375 into a pass state. Conversely, ATE tester 335 resets pass/fail signal 375 into a fail state if the output vector from DUT 115 indicates a malfunction.

An image/data processing module 380 receives the output of detector 345, LSM 315, and pass/fail signal 375. For example, image/data processing module 380 may include a spectrum analyzer 360 and frame grabber 340 as discussed with regard to LVP system 300 in FIG. 3A. ATE tester 335 also drives LSM 315 with a trigger signal that synchronizes the operation of LSM 315. In particular, LSM 315 may shift the laser illumination to a subsequent pixel after a complete test execution by ATE tester 335. LSM 315 relays the trigger signal to image/data processing module 380 to further synchronize the imaging of DUT 115.

In contrast to LVP system 300, DLS system 370 detects the presence of soft failures that result when the laser stimulation forces the active circuitry to change pass/fail signal 375 from a passing state to a failing state. These types of failures are said to be "soft" if they only occur under in certain voltage, temperature, or frequency ranges. Typically these are toward the edge or corner of an operational window or box as defined in the product specification. These failures can also occur under certain functional conditions, for instance a type of operation that places additional stress on an IC, like a graphics-intensive routine in a microprocessor. A DLS analysis is becoming more important because an increasing fraction of today's advanced ICs fail "soft." Problems due to process variations lead to these failures. Shrinking feature sizes lead to more variability, as the tolerance cannot be scaled at the same rate as the feature size. The uses of resolution enhancement techniques (RETs) like optical proximity correction, phase shift masks, and double (or triple) patterning lead to variations in lithography that are difficult to accurately model during the design process. Variations in chemical mechanical planarization due to surface density effects and other issues also contribute to this problem. The enhanced resolution from visible laser 305 as enabled by transparent coversheet 215 allows a circuit manufacturer to identify these soft failures to improve product quality.

LVP tool 300 detects the presence of hard failures that exist regardless of whether DUT 115 is stimulated by laser light. Despite these differences, the methods of operation for LVP tool 300 and DLS tool 370 are analogous. For example, a method of operation for fault analysis tool 200 will now be discussed with regard to FIG. 4. The method includes an act 400 of placing a transparent coversheet on a backside of a thinned die so that a first surface of the transparent coversheet contacts the backside. An example of act 400 is a technician placing transparent coversheet 215 on the backside of thinned die 215 while setting up fault analysis tool 200 of FIG. 2. In addition, the method includes an act 405 of contacting a second surface of the transparent coversheet with a lens while the first surface of the transparent coversheet contacts the backside of the thinned die. An example of act 405 would be adjusting objective backing 205 so that SIL 210 contacts the upper surface of transparent coversheet 215 while setting up fault analysis tool 200 of FIG. 2.

Figure 4:
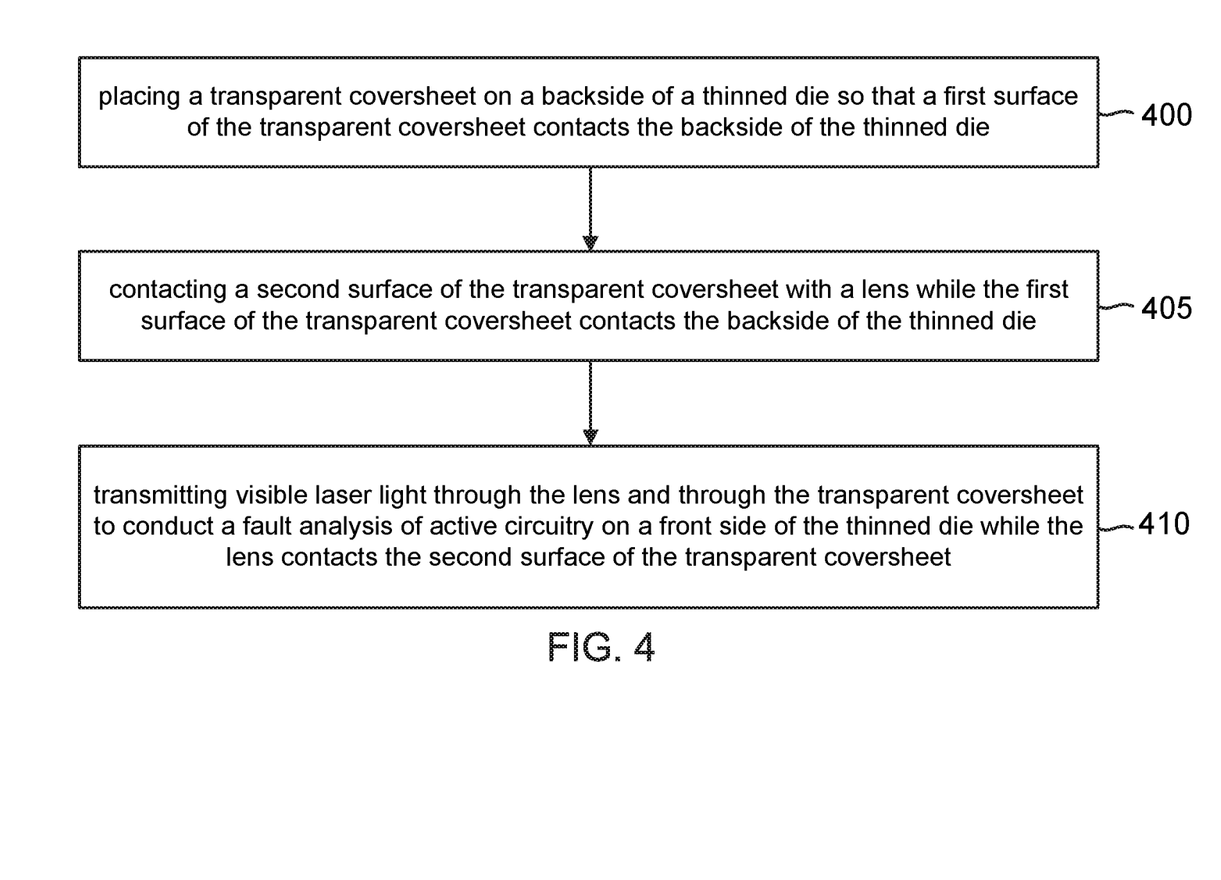
FIG. 4 is a flowchart for an example method of visible light fault analysis in accordance with an aspect of the disclosure.

Finally, the method includes an act 410 of transmitting visible laser light through the lens and through the transparent coversheet to conduct a fault analysis of active circuitry on a front side of the thinned die while the lens contacts the second surface of the transparent coversheet. An example of act 410 is conducting a laser voltage probing fault analysis through SIL 210 and transparent coversheet 215 as discussed with regard to FIG. 3A or the use of the same components in a dynamic laser stimulation fault analysis as discussed with regard to FIG. 3B.

Those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A method, comprising:
    placing a transparent coversheet on a backside of a thinned die so that a first surface of the transparent coversheet contacts the backside of the thinned die;

contacting a second surface of the transparent coversheet with a lens while the first surface of the transparent coversheet contacts the backside of the thinned die; and transmitting visible light through the lens and through the transparent coversheet while conducting a fault analysis of active circuitry on a front side of the thinned die and while the lens contacts the second surface of the transparent coversheet, wherein a thickness of the transparent coversheet is greater than a thickness of the thinned die.

2. The method of claim 1, wherein placing the transparent coversheet on the backside of the thinned die completely covers the backside of the thinned die with the first surface of the transparent coversheet.

3. The method of claim 1, wherein transmitting visible light through the lens comprises transmitting visible laser light through a solid immersion lens.

4. The method of claim 1, further comprising conducting heat from the active circuitry into the transparent coversheet.

5. The method of claim 1, wherein placing the transparent coversheet on the backside of the thinned die comprises placing a transparent coversheet constructed from a material selected from the group consisting of GaP, AlP, InP, and diamond on the backside of the thinned die.

6. The method of claim 1, wherein transmitting the visible light through the lens and through the transparent coversheet to conduct the fault analysis of active circuitry on the front side of the thinned die comprises transmitting the visible light in a wavelength band ranging from 400 nm to 800 nm.

7. The method of claim 1, wherein transmitting the visible light through the lens and through the transparent coversheet to conduct the fault analysis of active circuitry on the front side of the thinned die comprises transmitting the visible light from a light emitting diode.

8. The method of claim 7, wherein the thickness of the thinned die is approximately 2 microns and the thickness of the transparent coversheet is approximately 100 microns, and wherein the light emitting diode is a superluminescent light emitting diode.

9. The method of claim 1, wherein transmitting the visible light through the lens and through the transparent coversheet to conduct the fault analysis of active circuitry on the front side of the thinned die comprises transmitting visible laser light to conduct a laser voltage probing analysis of the active circuitry.

10. The method of claim 1, wherein transmitting the visible light through the lens and through the transparent coversheet to conduct the fault analysis of active circuitry on the front side of the thinned die comprises transmitting visible laser light to conduct a dynamic laser stimulation analysis of the active circuitry.

11. A fault analysis tool, comprising:
a thinned die having active circuitry on a front side and a backside;
a transparent coversheet on the backside of the thinned die, wherein a thickness of the transparent coversheet is greater than a thickness of the thinned die;
a visible light source;
a lens on the transparent coversheet, wherein the lens is configured to focus visible light from the visible light source through the transparent coversheet and through the backside of the die onto the active circuitry; and
a laser scanning module configured to form an optical image from reflections of the visible light from the active circuitry.

12. The fault analysis tool of claim 11, wherein the lens is a solid immersion lens.

13. The fault analysis tool of claim 11, wherein the transparent coversheet comprises a material selected from the group consisting of GaP, AlP, InP, and diamond.

14. The fault analysis tool of claim 11, wherein the transparent coversheet has an index of refraction greater than 2.4 in a visible wavelength range and has a thermal conductivity greater than 5 W/m-K.

15. The fault analysis tool of claim 11, wherein the thickness of the transparent coversheet is approximately 100 microns and the thickness of the thinned die is approximately 2 microns.

16. The fault analysis tool of claim 11, wherein the thinned die comprises a thinned silicon substrate.

17. The fault analysis tool of claim 11, wherein the fault analysis tool is selected from a group consisting of a laser voltage probing fault analysis tool and a dynamic laser stimulation fault analysis tool.

* * * * *